United States Patent
Frydman

(10) Patent No.: US 9,646,115 B2
(45) Date of Patent: May 9, 2017

(54) DETERMINING A LIMIT OF FAILURE IN A WELLBORE WALL

(71) Applicant: Schlumberger Technology Corporation, Sugar Land, TX (US)

(72) Inventor: Marcelo Frydman, Rio De Janeiro (BR)

(73) Assignee: Schlumberger Technology Corporation, Sugar Land, TX (US)

( * ) Notice: Subject to any disclaimer, the term of this patent is extended or adjusted under 35 U.S.C. 154(b) by 621 days.

(21) Appl. No.: 13/863,572

(22) Filed: Apr. 16, 2013

(65) Prior Publication Data
US 2013/0275099 A1 Oct. 17, 2013

Related U.S. Application Data

(60) Provisional application No. 61/625,453, filed on Apr. 17, 2012.

(51) Int. Cl.
*G06F 7/60* (2006.01)
*G06F 17/50* (2006.01)
(Continued)

(52) U.S. Cl.
CPC .......... *G06F 17/5009* (2013.01); *E21B 21/08* (2013.01); *E21B 47/10* (2013.01); *G01V 99/005* (2013.01)

(58) Field of Classification Search
CPC .............................. G06F 17/5009; E21B 21/08
See application file for complete search history.

(56) References Cited

U.S. PATENT DOCUMENTS 4,879,654 A * 11/1989 Bruce ................... E21B 49/006
175/48
6,151,961 A * 11/2000 Huber ..................... E21B 41/00
166/250.01
(Continued)

FOREIGN PATENT DOCUMENTS

WO 2008/098031 A1 8/2008

OTHER PUBLICATIONS

Fjær et al.("Petroleum Related Rock Mechanics", Elsevier B.V., 2008, pp. 1-485).*
(Continued)

*Primary Examiner* — Omar Fernandez Rivas
*Assistant Examiner* — Iftekhar Khan
(74) *Attorney, Agent, or Firm* — Mitchell M. Blakely

(57) ABSTRACT

A method to determine a drilling fluid density limit involves obtaining a geomechanical model of a target borehole, generating a depth of damage model of the target borehole to describe a relationship between a drilling fluid pressure and a depth of damage representing a modeled amount of yielded rock surrounding the target borehole, where the modeled amount of the yielded rock is calculated using a stress model according to a pre-determined failure criterion, and calculating, using the depth of damage model and the geomechanical model, the drilling fluid density limit as a function of the subterranean formation depth, where the drilling fluid density limit maintains the depth of damage at a target level for the target borehole, where the drilling fluid density limit corresponds to a depth gradient of the drilling fluid pressure, where the target borehole is drilled based at least on the drilling fluid density limit.

21 Claims, 8 Drawing Sheets

(51) Int. Cl.
   *E21B 47/10* (2012.01)
   *E21B 21/08* (2006.01)
   *G01V 99/00* (2009.01)

(56) References Cited

U.S. PATENT DOCUMENTS

| | | | |
|---|---|---|---|
| 8,736,263 B2* | 5/2014 | Minh | G01N 24/081 324/303 |
| 2002/0010548 A1* | 1/2002 | Tare et al. | 702/9 |
| 2003/0168257 A1 | 9/2003 | Aldred et al. | |
| 2004/0122640 A1* | 6/2004 | Dusterhoft | 703/10 |
| 2004/0176911 A1* | 9/2004 | Bratton | G01V 1/50 702/6 |
| 2005/0113262 A1* | 5/2005 | Ravi | C09K 8/03 507/125 |
| 2005/0161262 A1* | 7/2005 | Jamison | 175/65 |
| 2006/0153005 A1 | 7/2006 | Herwanger et al. | |
| 2006/0285437 A1* | 12/2006 | Sinha | G01V 1/50 367/37 |
| 2007/0027036 A1* | 2/2007 | Polizzotti et al. | 507/143 |
| 2007/0294034 A1* | 12/2007 | Bratton | E21B 41/00 702/6 |
| 2008/0319675 A1* | 12/2008 | Sayers | 702/11 |
| 2009/0132218 A1* | 5/2009 | Ledgerwood, III | 703/7 |
| 2009/0151937 A1* | 6/2009 | Goodwin et al. | 166/250.17 |
| 2009/0163388 A1* | 6/2009 | Reddy | B29C 44/3496 507/205 |
| 2010/0155142 A1 | 6/2010 | Thambynayagam et al. | |
| 2010/0243328 A1* | 9/2010 | Rodriguez Herrera | 175/61 |
| 2011/0125333 A1* | 5/2011 | Gray | 700/282 |
| 2011/0153296 A1 | 6/2011 | Sadlier et al. | |
| 2011/0198076 A1* | 8/2011 | Villreal | E21B 21/08 166/250.01 |
| 2014/0326449 A1* | 11/2014 | Samuel | E21B 44/00 166/250.01 |

OTHER PUBLICATIONS

Frink et al.("Managed pressure drilling—what's in a name?", Drilling Contractor, 2006).*
Chenevert, et al., Shale Swelling at Elevated Temperature and Pressure, Proc. 33rd U.S. Rock Mechanics Symposium, Santa Fe, USA, 1992, pp. 869-878.
Gazanoil, et al., "Wellbore Failure Mechanisms in Shales: Prediction and Prevention," European Petroleum Conf., London, UK, 1994, pp. 459-471.
Hawkes, et al., "A New Model for Predicting Time-Dependent Failure of Shales: Theory And Application," Paper 97-131, presented at 48th meeting of The Petroleum Society, Calgary, Jun. 1997.
Hawkes, et al., "Coupled Modeling of Borehole Instability and Multiphase Flow for Underbalanced Drilling," IACD/SPE Drilling Conference, Dallas, Feb. 2002.
International Search Report and Written Opinion issued in PCT/US2013/036918 on Jul. 8, 2013, 9 pages.
McLellan, "Assessing the Risk of Wellbore Instability in Horizontal and Inclined Wells," Journal of Canadian Petroleum Technology, vol. 35, No. 5.
Mody, et al., A Borehold Stability Model to Couple the Mechanics and Chemistry of Drilling Fluid Interaction, Proc. SPE/IADC Drilling Conf., Amsterdam, The Netherlands, 1993, pp. 473-490.
Qadmani et al., "Field-Based Drilling Fluid Design Optimization Methodology Successfully Mitigated Time-Dependent Shale Instability in Khafji Field," International Petroleum Technology Conference Doha, Qatar, 2009.
Sayers et al., "The effect of near-wellbore yield on elastic wave velocities in sandstones," SEG Technical Program Expanded Abstracts, vol. 27, Issue 1, Jan. 2008, pp. 339-343.
Tan et al., "A Novel Method of Screening Drilling Muds Against Mud Pressure Penetration for Effective Borehole Wall Support," IADC/SPE Asia Pacific Drilling Technology Cof., Kuala Lumpur, Malaysia, 1996, pp. 287-294.
Tan et al., "Development and Laboratory Verification of High Membrane Efficiency Water-Based Drilling Fluids with Oil-Based Drilling Fluid-Like Performance ain Shale Stabilization," OilRock 2002, Irving, Texas, 2002.
Tan, et al., Effects of Swelling and Hydrational Stress in Shales on Wellbore Stability, Asia Pacific Oil and Gas Conference and Exhibition, Kuala Lumpur, Malaysia, 1997, pp. 345-349.
Tan, et al., Integrated Approach to Drilling Fluid Optimisation for Efficient Shale Instability Management, Proc. SPE Internatinal Oil and Gas Conference and Exhibition in China, Beijing, China 1998, pp. 441-456.
Tan et al., Managing Physico-Chemical Wellbore Instability in Shales with the Chemical Potential Mechanism, Proc. Asia Pacific Oil and Gas Conference and Exhibition, Adelaide, Australia, 1996, pp. 107-116.
Tan et al., Optimization of Drilling Fluid Design for Managing Wellbore Instability in K-Shale in the Malay Basin of Penninsular Malaysia, OilRock 2002 Irving Texas.
Tan et al., "Successful Mitigation of Time-Dependent Shale Instability in Khafji Field Through Drilling Fluid-Design Optimization," SPE Saudi Arabia Section Technical Symposium and Exhibition, Al-Khobar, Saudi Arabia, 2009a.
van Oort, et al., "Manipulation of Coupled Osmotic Flows for Stabilisation of Shales Exposed to Water-Based Drilling Fluids," Proc. 70th SPE Annual Technical Conference and Exhibition, Dallas USA, 1995, pp. 497-509.
Tan et al,, "Fluid Design Solves Shale Instability Problem", Hart E&P, pp. 66-67, Nov. (2009b).
Whitworth et al., "Electrolyte-induced Solute Permeability Effects in Compacted Smectite Membranes", Applied Geochemistry, pp. 533-546 (1994).
Supplementary EP Search Report for corresponding European Application Serial No. EP13777709.0, dated Nov. 27, 2015, 3 pp.
European Examination Report for corresponding European Application Serial No. EP13777709.0, dated Dec. 14, 2015, 7 pp.
Bradford, et al., "When Rock Mechanics Met Drilling: Effective Implementation of Real-Time Wellbore Stability Control, " IADC/SPE 59121, Feb. 23-25, 2000, 13 pp.
Sayers, et al., "Determination of Rock Strength Using Advance Sonic Log Interpretation Techniques," SPE 124161, Oct. 4-7, 2009, 15 pp.
Zervos, et al., "Elastoplastic Finite Element Analysis of Inclined Wellbores," SPE/ISRM 47322, Jul. 8-10, 1998, 10 pp.
Papanastasiou, et al, "Stability of a Multilateral Junction: Experimental Results and Numerical Modeling," SPE 78212, (2006), pp. 4-11.
Yuan, et al., "Modeling Breakout and Near-Well Fluid Flow of a Borehole in an Anisotropic Stress Field", ARMA/USRMS 06-1157, (2005) 10 pp.
Germanovich, et al., "Fracture Mechanisms and Instability of Openings in Compression," International Journal of Rock Mechanics and Mining Sciences, vol. 37 (2000) pp. 263-284.
Shen, et al, "Simulation of Borehole Breakouts Using FRACOD2D," Oil & Gas Science and Technology, Rev. IFP, vol. 57 (2002) pp. 579-950.

* cited by examiner

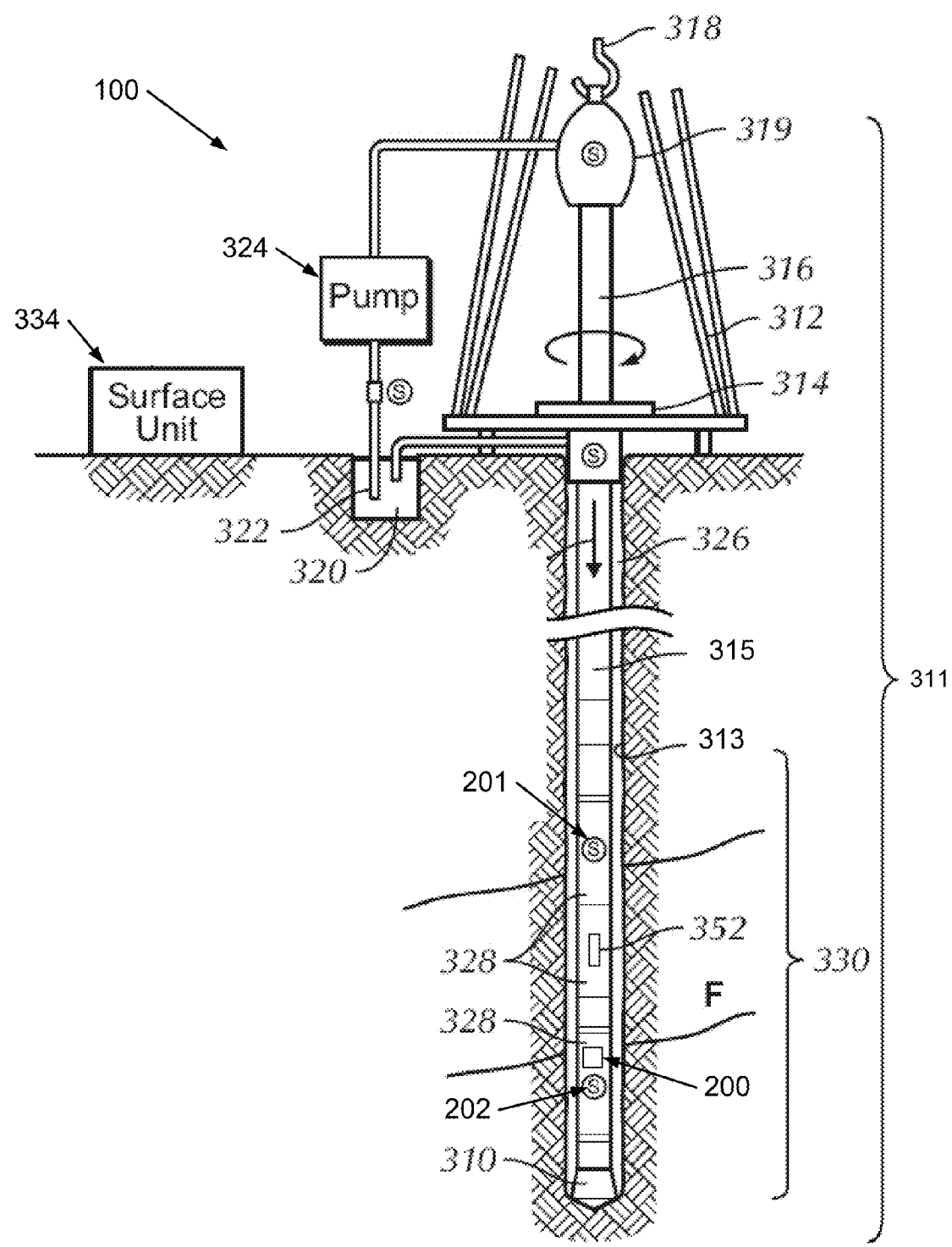
FIG. 1.1

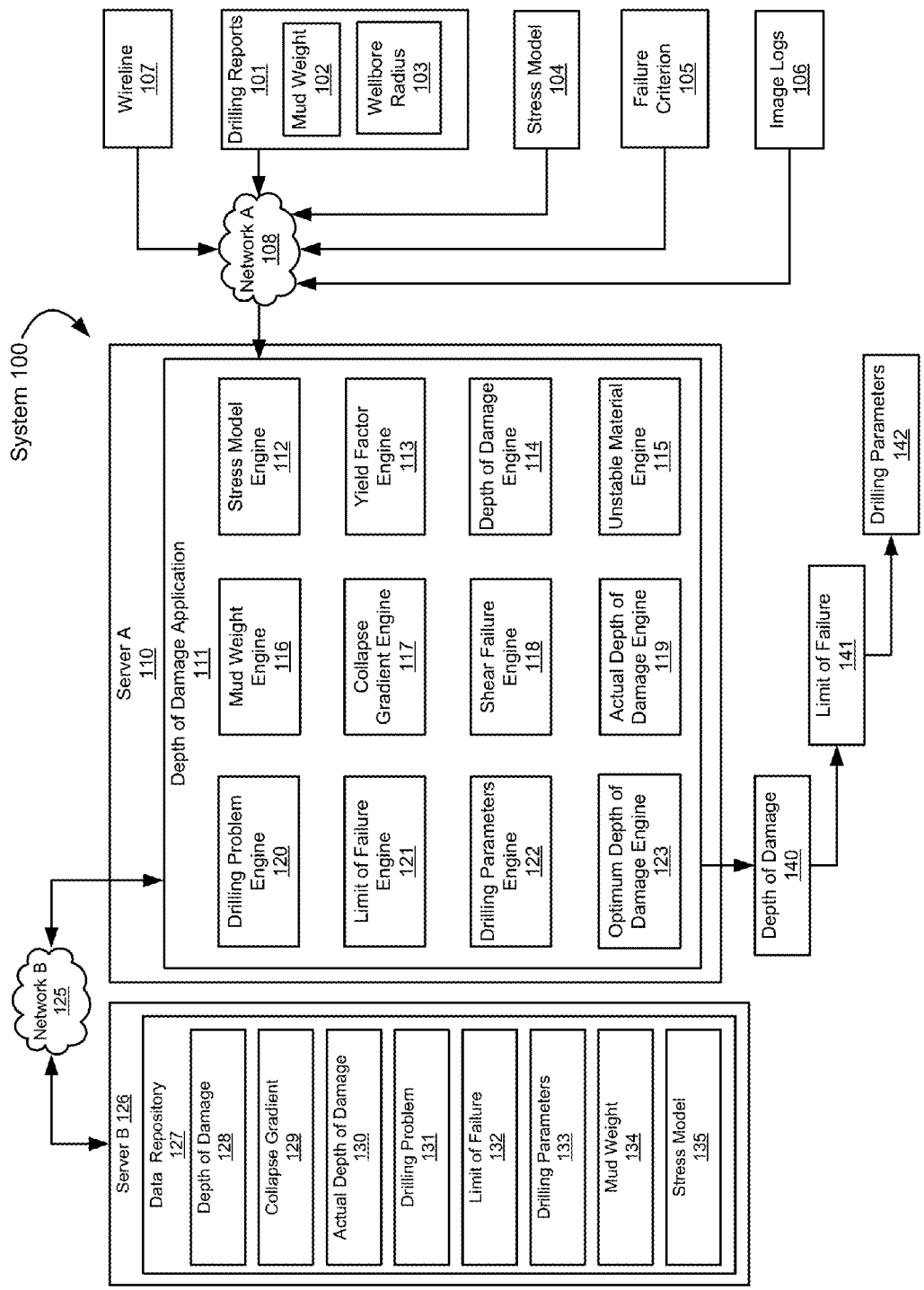
FIG. 1.2

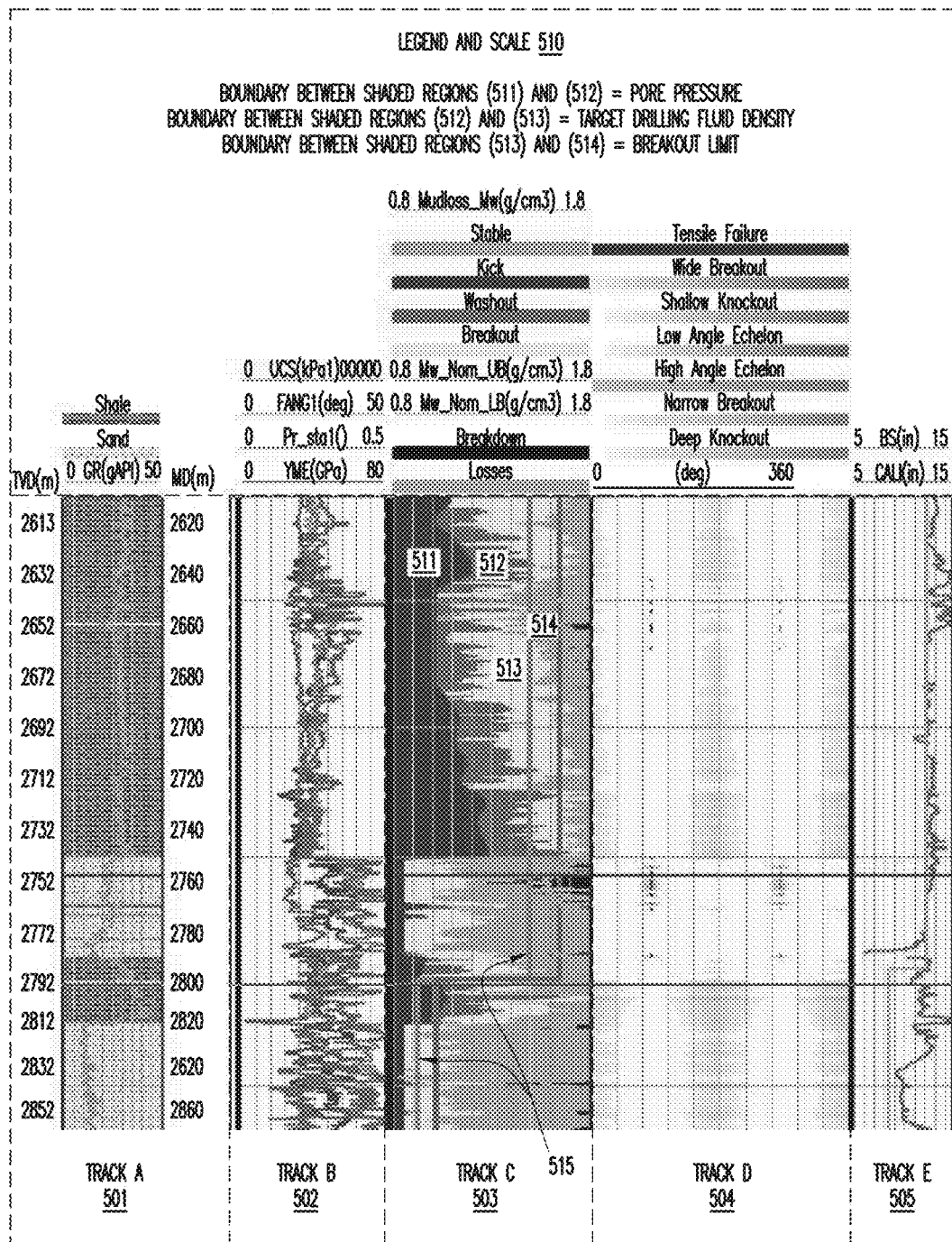
FIG.5.1

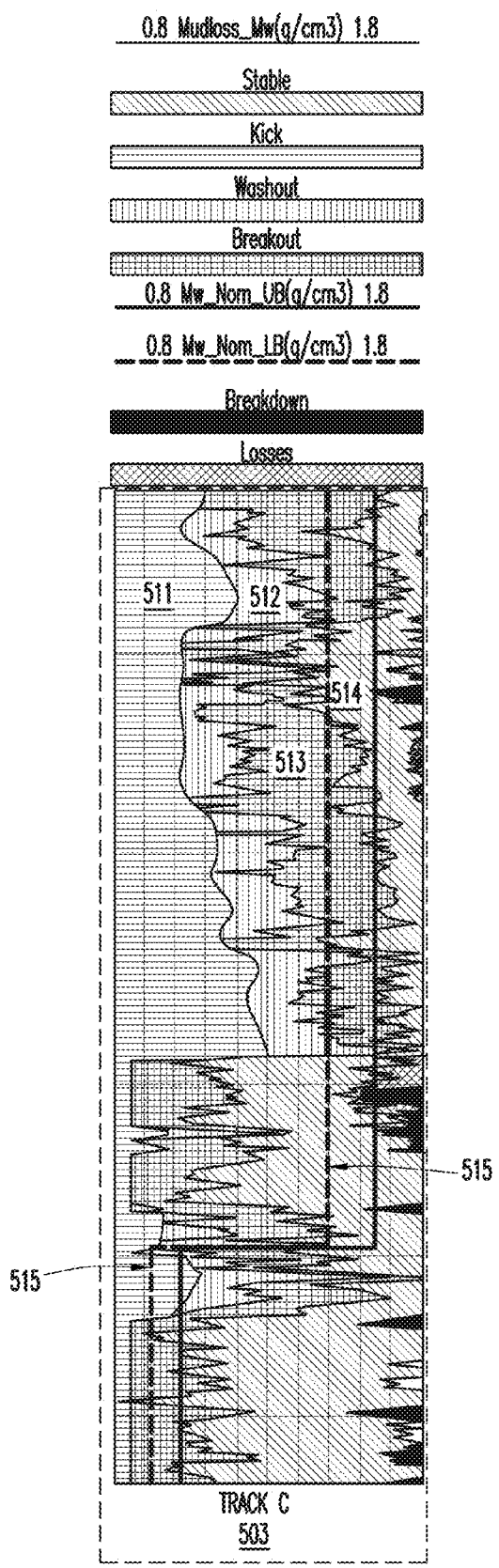
FIG.5.2

DETERMINING A LIMIT OF FAILURE IN A WELLBORE WALL

CROSS-REFERENCE TO RELATED APPLICATIONS

This application claims benefit under 35 U.S.C. §119(e) of U.S. Provisional Patent Application No. 61/625,453, filed on Apr. 17, 2012, and entitled "DETERMINING A LIMIT OF FAILURE IN A WELLBORE WALL," which is hereby incorporated by reference.

BACKGROUND

Wellbore stability during drilling ensures that a wellbore can reach its target and be secured with casing without incurring any injury, loss of time or equipment due to the geomechanics of the overburden and reservoir.

SUMMARY

In general, in one aspect, the invention relates to a method to determine a drilling fluid density limit for maintaining a target amount of rock failure in a drilling operation. The method includes obtaining a geomechanical model of a portion of a subterranean formation traversed by a target borehole, wherein the geomechanical model comprises a formation pressure dependent on subterranean formation depth, generating, by a computer processor using a stress model dependent on the formation pressure, a depth of damage model of the target borehole, wherein the depth of damage model describes a relationship between a drilling fluid pressure and a depth of damage resulting from the drilling fluid pressure, wherein the depth of damage represents a modeled amount of yielded rock surrounding the target borehole, wherein the modeled amount of the yielded rock is calculated using the stress model according to a pre-determined failure criterion, and calculating, by the computer processor using the depth of damage model and the geomechanical model, the drilling fluid density limit as a function of the subterranean formation depth, wherein the drilling fluid density limit maintains the depth of damage at a target level for the target borehole, wherein the drilling fluid density limit corresponds to a depth gradient of the drilling fluid pressure, wherein the target borehole is drilled based at least on the drilling fluid density limit.

In general, in one aspect, the invention relates to a system for performing a drilling operation with a target amount of rock failure. The system includes a drilling system having a drill string for drilling a target borehole, wherein the drill string is configured to provide a circulation path for drilling fluid in the target borehole during drilling, and a surface unit comprising (i) a processor, (ii) a depth of damage application executing on the processor and configured to obtain a geomechanical model of a portion of the subterranean formation traversed by the target borehole, wherein the geomechanical model comprises a formation pressure dependent on subterranean formation depth, generate, using a stress model dependent on the formation pressure, a depth of damage model of the target borehole, wherein the depth of damage model describes a relationship between a drilling fluid pressure and a depth of damage resulting from the drilling fluid pressure, wherein the depth of damage represents a modeled amount of yielded rock surrounding the target borehole, wherein the modeled amount of the yielded rock is calculated using the stress model according to a pre-determined failure criterion, and calculate, using the depth of damage model and the geomechanical model, a target drilling fluid density as a function of the subterranean formation depth, wherein the target drilling fluid density maintains the depth of damage at a target level for the target borehole, wherein the target drilling fluid density corresponds to a depth gradient of the drilling fluid pressure, and (iii) a repository for storing the geomechanical model, the depth of damage model, and the target drilling fluid density as the function of the subterranean formation depth, wherein the target borehole is drilled based at least on the target drilling fluid density.

In general, in one aspect, the invention relates to a non-transitory computer readable storage medium storing instructions for determining a drilling fluid density limit for maintaining a target amount of rock failure in a drilling operation. The instructions are executable on a processor and comprising functionality for obtaining a geomechanical model of a portion of a subterranean formation traversed by a target borehole, wherein the geomechanical model comprises a formation pressure dependent on subterranean formation depth, generating, using a stress model dependent on the formation pressure, a depth of damage model of the target borehole, wherein the depth of damage model describes a relationship between a drilling fluid pressure and a depth of damage resulting from the drilling fluid pressure, wherein the depth of damage represents a modeled amount of yielded rock surrounding the target borehole, wherein the modeled amount of the yielded rock is calculated using the stress model according to a pre-determined failure criterion, and calculating, using the depth of damage model and the geomechanical model, the drilling fluid density limit as a function of the subterranean formation depth, wherein the drilling fluid density limit maintains the depth of damage at a target level for the target borehole, wherein the drilling fluid density limit corresponds to a depth gradient of the drilling fluid pressure, wherein the target borehole is drilled based at least on the drilling fluid density limit.

Other aspects of the invention will be apparent from the following description and the appended claims.

BRIEF DESCRIPTION OF DRAWINGS

FIG. 1.1 is a schematic view of a wellsite depicting a drilling operation in which one or more embodiments of determining a limit of failure in a wellbore wall may be implemented.

FIG. 1.2 shows a system for determining a limit of failure in a wellbore wall in accordance with one or more embodiments.

FIGS. 5.1 and 5.2 show an example of determining a limit of failure in a wellbore wall in accordance with one or more embodiments.

DETAILED DESCRIPTION

Figure 2:
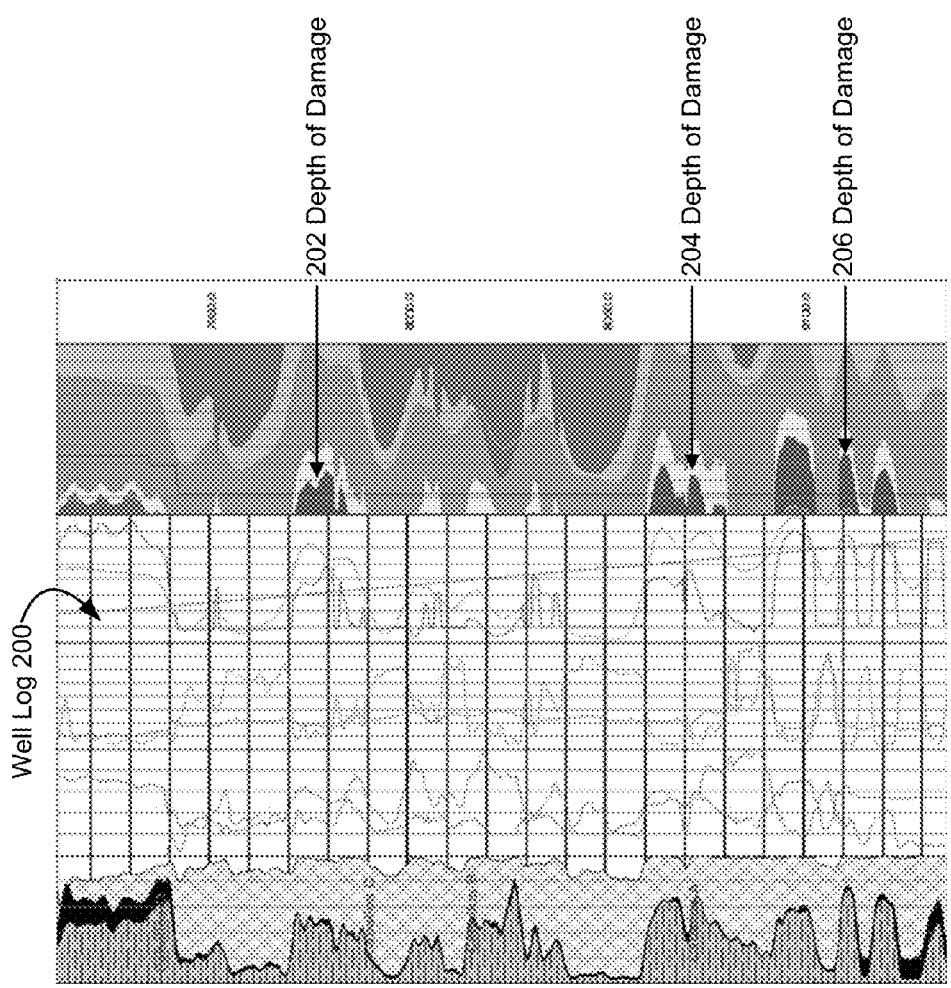
FIG. 2 shows a well log for determining a limit of failure in a wellbore wall in accordance with one or more embodiments.

Specific embodiments will now be described in detail with reference to the accompanying figures. Like elements in the various figures are denoted by like reference numerals for consistency.

In the following detailed description of embodiments, numerous specific details are set forth in order to provide a more thorough understanding. However, it will be apparent to one of ordinary skill in the art that the disclosed subject matter of the application may be practiced without these specific details. In other instances, well-known features have not been described in detail to avoid unnecessarily complicating the description.

When a wellbore is drilled, the material removed is no longer supporting the surrounding rocks. In place of the material removed during drilling, the surrounding rocks are only partially supported by drilling fluid pressure that is created by the column of drilling fluid circulating in the wellbore. As a result, the stresses become concentrated around the wellbore causing non-elastic deformations, such as post yield rock behavior of plasticity. Such non-elastic deformations occur when rocks are stressed beyond the yield point turning into yielded rocks. For example, borehole breakouts are stress-induced enlargements of the wellbore cross-section associated with the yielded rocks surrounding the wellbore. Gradual deterioration of rock microstructure often exists in the yielded rocks. Specifically, borehole breakouts occur when excessive stresses around the borehole cause compressive failure of the borehole wall due to the surrounding deteriorating rock microstructure. Throughout this disclosure, the term "damage" refers to such deterioration of the rock microstructure surrounding the wellbore, and the terms "wellbore" and "borehole" may be used interchangeably.

In general, embodiments provide a system and method for determining a limit of failure in a wellbore wall. The limit of failure (also referred to as limit of damage) is an upper limit to the amount of drilling induced damage before wellbore instability presents a problem to the drilling process. In one or more embodiments, determining the limit of failure includes determining a drilling fluid density limit in a target wellbore to maintain a target amount of damage for optimum drilling efficiency. For example, the optimum drilling efficiency may be a trade-off between risk of wellbore instability due to rock failure and expenses associated with drilling fluid, wellbore monitoring, and other drilling practice. In one or more embodiments, the amount of damage is represented by an equivalent radial distance across the volume of yielded rocks surrounding the wellbore. This equivalent radial distance is referred to as the depth of damage. In one or more embodiments, determining the drilling fluid density limit may include determining various historical depths of damage at different locations within previously drilled wellbores where non-productive drilling events occurred. The historical depths of damage may be used to modify a drilling plan with various drilling parameters. In one or more embodiments, modifying the drilling plan assists to ensure a smooth and proficient drilling process for the target wellbore.

FIG. 1.1 is a schematic view of a wellsite (100) depicting a drilling operation. The wellsite (100) includes a drilling system (311) and a surface unit (334). In the illustrated embodiment, a borehole (313) is formed by rotary drilling in a manner that is well known. Those of ordinary skill in the art given the benefit of this disclosure will appreciate, however, that determining a limit of failure in a wellbore wall as disclosed herein may also be used in drilling applications other than conventional rotary drilling (e.g., mudmotor based directional drilling), and is not limited to land-based rigs.

The drilling system (311) includes a drill string (315) suspended within the borehole (313) with a drill bit (310) at its lower end. The drilling system (311) also includes the land-based platform and derrick assembly (312) positioned over the borehole (313) penetrating a subterranean formation (F). The assembly (312) includes a rotary table (314), kelly (316), hook (318) and rotary swivel (319). The drill string (315) is rotated by the rotary table (314), energized by means not shown, which engages the kelly (316) at the upper end of the drill string (315). The drill string (315) is suspended from a hook (318), attached to a traveling block (also not shown), through the kelly (316) and a rotary swivel (319) which permits rotation of the drill string relative to the hook.

The drilling system (311) further includes drilling fluid (320) (e.g., mud) stored in a pit (322) formed at the well site. A pump (324) delivers the drilling fluid (320) to the interior of the drill string (315) via a port in the swivel (319), inducing the drilling fluid to flow downwardly through the drill string (315) as indicated by the directional arrow. The drilling fluid (320) exits the drill string (315) via ports in the drill bit (310), and then circulates upwardly through the region between the outside of the drill string (315) and the wall of the borehole (313), called the annulus (326). In this manner, the drilling fluid (320) lubricates the drill bit (310) and carries formation cuttings up to the surface as it is returned to the pit (322) for recirculation.

The drill string (315) further includes a bottom hole assembly (BHA) (330), near the drill bit (310). In other words, the BHA may be located within several drill collar lengths from the drill bit. The BHA (330) includes capabilities for measuring, processing, and storing information, as well as communicating with the surface unit (334). The BHA (330) further includes drill collars (328) for performing various other measurement functions.

Sensors (S) are located about the wellsite to collect data, which may be in real time, concerning the operation of the wellsite, as well as conditions at the wellsite. The sensors (S) may also have features or capabilities, of monitors, such as cameras (not shown), to provide pictures of the operation. Surface sensors or gauges (S) may be deployed about the surface systems to provide information about the surface unit, such as standpipe pressure, hook load, depth, surface torque, rotary rotations per minute (rpm), among others. Downhole sensors or gauges (S) are disposed about the drilling tool and/or wellbore to provide information about downhole conditions, such as wellbore pressure, weight on bit, torque on bit, direction, inclination, collar rpm, tool temperature, annular temperature and toolface (i.e., angle of a tool), among others. Multiple downhole sensors (S) may be located at different positions on BHA (330), such as sensor (201) and sensor (202). In one or more embodiments, sensor (201) and sensor (202) may include one or more of acoustics-while-drilling sensor, formation pressure sensor, resistivity sensor, caliper sensor, density sensor, and porosity, sensor. The information collected by the sensors is conveyed to the various parts of the drilling system and/or the surface unit (334).

The surface unit (334) may include all or a portion of a limit of failure determining tool (i.e., system (100) depicted in FIG. 1.2). Alternatively, all or a portion of the limit of failure determining tool may be located in a remote location from the oilfield. In one or more embodiments, the limit of failure determining tool includes functionality to determine a limit of failure corresponding to a target amount of rock failure that is manageable for drilling the borehole (313). In particular, determining the limit of failure includes determining a drilling fluid density for maintaining the target amount of rock failure surrounding the borehole (313). In one or more embodiments, determining the drilling fluid density limit includes determining various historical depths of damage within the walls of previously drilled boreholes in a similar subterranean formation as the borehole (313). The limit of failure determining tool is discussed in further detail below with respect to FIG. 1.2.

Continuing with FIG. 1.1, the drilling system (311) is operatively connected to the surface unit (334) for communication therewith. The BHA (330) is provided with a communication subassembly (352) that communicates with the surface unit (334). The communication subassembly (352) is adapted to send signals to and receive signals from the surface using mud pulse telemetry. The communication subassembly (352) may include, for example, a transmitter that generates a signal, such as an acoustic or electromagnetic signal, which is representative of the measured drilling parameters. It will be appreciated by one of skill in the art that a variety of telemetry systems may be employed, such as mud pulse telemetry, wired drill pipe, electromagnetic or other known telemetry systems.

Typically, the wellbore is drilled according to a drilling plan that is established prior to drilling. The drilling plan typically sets forth equipment, pressures, trajectories and/or other parameters that define the drilling process for the wellsite. The drilling operation may then be performed according to the drilling plan. However, as information is gathered, the drilling operation may deviate from the drilling plan. Additionally, as drilling or other operations are performed, the subsurface conditions may change. The earth model may also be adjusted as new information is collected. Such information may include results generated by the limit of failure determining tool that are used to identify corrective actions to address a drilling event. For example, the drilling plan may be adjusted based on the limit of failure and/or limit of drilling fluid density.

The subterranean assets are not limited to hydrocarbons such as oil, throughout this document, the terms "oilfield" and "oilfield operation" may be used interchangeably with the terms "field" and "field operation" to refer to a site where any type of valuable fluids can be found and the activities for extracting them. The terms may also refer to sites where substances are deposited or stored by injecting them into the surface using boreholes and the operations associated with this process. Further, the term "field operation" refers to a field operation associated with a field, including activities related to field planning, wellbore drilling, wellbore completion, and/or production using the wellbore.

FIG. 1.2 shows a system (100) in accordance with one or more embodiments. In one or more embodiments, the system (100) is referred to as a limit of failure determining tool. As shown in FIG. 1.2, the system (100) includes components such as a depth of damage application (111) and a data repository (127). These components are described below and may be located on the same device (e.g. a server, mainframe, desktop Personal Computer (PC), laptop, Personal Digital Assistant (PDA), telephone, mobile phone, kiosk, cable box, and any other device) or may be located on separate devices connected by a network (e.g. the Internet, a wide area network (WAN), or a local area network (LAN)), with wired and/or wireless segments. In one or more embodiments, there may be more than one depth of damage application running on a device, as well as more than one wireline, drilling report, stress model, failure criterion, and/or image log interfacing with that component.

In one or more embodiments, the process of determining a limit of failure and/or limit of drilling fluid pressure may use various inputs, including drilling reports (101) that may include caliper logs and drilling events with associated parameters such as mud weight (102) and wellbore radius (103), as well as a stress model (104), a failure criterion (105), and image logs (106). Each of these inputs may be data obtained, directly or indirectly, from oilfield equipment located at an oilfield, theoretical values based on mathematical models, and/or other sources of data. In one or more embodiments, the drilling reports (101) may be generated based on the measurements of the sensor (201) and sensor (202), shown in FIG. 1.1, and the failure criterion (105) may include the Mohr-Coulomb failure criterion known to those skilled in the art. Each of these inputs may be transferred to a depth of damage application (111) via a network A (108). Other inputs to the depth of damage application (111) that are not described may be used.

In one or more embodiments, a server A (110) is configured to host a depth of damage application (111). The depth of damage application (111) is a software application that includes several engines (i.e., software modules) configured to perform specific functions to determine depths of damage and a limit of failure in a wellbore wall, as well as determining a limit of drilling fluid pressure to maintain manageable wellbore stability during drilling. Specifically, engines operating as part of the depth of damage application (111) may include functionality to calculate stresses, calculate yield functions, calculate yield factors, calculate a damage of a breakout in the wellbore wall, calculate a depth of damage ratio, determine a volume of unstable wellbore wall material, determine an initial mud weight, determine a collapse gradient, determine a minimum mud weight, calculate an actual depth of damage experienced, identify a drilling problem, determine a limit of failure, and perform other calculations associated with determining a drilling fluid density limit in a target wellbore. Details of using the depth of damage application (111) to perform calculations associated with determining a drilling fluid density limit in a target wellbore are described in reference to FIG. 4 below.

The depth of damage application (111) may receive input from various sources, including a wireline (107) logs and/or logging while drilling logs, drilling reports (101), a stress model (104), a failure criterion (105), and/or image logs (106). The depth of damage application (111) may store data in and/or access data from a data repository (127). The server A (110), the depth of damage application (111), and other data stored on the server A (110) may be owned and/or operated by a service provider (e.g. the owner, developer, and/or manager of the depth of damage application (111)). The depth of damage application (111) may include software engines such as a stress model engine (112), a yield factor engine (113), a depth of damage engine (114), an unstable material engine (115), a mud weight engine (116), a collapse gradient engine (117), a shear failure engine (118), an actual depth of damage engine (119), a drilling problem engine (120), an limit of failure engine (121), a drilling parameters engine (122), and an optimum depth of damage engine (123). Each engine of the depth of damage application (111) is described below. Each of the engines described may have other functionality beyond that disclosed, and that the functionality of each engine may also be performed by any of the other engines.

In one or more embodiments, a stress model engine (112) is configured to calculate stresses at a radius inside the wellbore wall. Stress is a measure of the internal forces acting within a deformable body. The stress model may be an elastic material model (e.g. linear), a poroelastic material model, or a non-linear material model. A linear elastic model is one which models the rock as a continuous solid material, and models the deformation of solid objects and internal stresses due to prescribed loading conditions. Linear elasticity models materials as continua that exhibit the ability to recover from deformations produced by external forces. Fundamental linearizing assumptions of linear elasticity include infinitesimal strains or small deformations, and linear relationships between stress and strain. An example of a linear elastic stress model is the set of Kirsch Equations, which describe the elastic stresses around a hole in an infinite plate in one directional tension:

$\sigma_r = P_w$ $\sigma_\theta = \sigma_H + \sigma_h - 2(\sigma_H - \sigma_h)\cos(2\theta) - P_w$ $\sigma_\alpha = \sigma_z - 2\nu(\sigma_H - \sigma_h)\cos(2\theta)$ $\tau_{r\theta} = \tau_{\theta z} = \tau_{rz} = 0$ Additionally, poroelastic models approximate the rock as a porous material. A porous material is a solid permeated by an interconnected network of pores (i.e., voids) filled with a fluid (e.g. liquid or gas). Usually both the solid matrix and the pore network are assumed to be continuous. Many natural substances such as rocks, soils, biological tissues, and man-made materials (e.g., foams, ceramics) may be considered porous material. Porous material with a solid elastic matrix and a viscous fluid matrix are called poroelastic. A poroelastic medium is characterized by its porosity, permeability, and the properties of its constituents (i.e., solid matrix and fluid). Thus, a poroelastic stress model is one which models the deformation of a continuous porous material. More general non-linear material models may also be used. These advanced models, including the previous assumptions of elastic reversibility and the linear relationship between the applied forces and the corresponding deformations, are not required.

In one or more embodiments, a yield factor engine (113) is configured to calculate, using the stresses, a yield function, and a yield factor. A yield function is a mathematical representation of the stresses associated with a wellbore wall. An example of a yield function is a five-dimensional yield surface in a six-dimensional space of stresses. The yield surface may be convex and the state of stress inside the yield surface is elastic. When the stress state lies on the surface, the material has reached its yield point and has become plastic. A yield factor corresponds to the ratio between applied stress and resistant stress. Values greater or equal to one indicate that the material is failing, and may deform plastically and/or fail generating cavings.

Unconfined compressive strength (UCS) is a parameter indicating rock strength, and is commonly used when performing wellbore stability predictions. The UCS of the specimen is calculated by dividing the maximum load at failure by the sample cross-sectional area or $\sigma_c = F/A$, where $\sigma_c$=unconfined compressive strength (psi), F=maximum failure load (lbs), and A=cross-sectional area of the core sample (in$^2$). The UCS is used to calculate a yield factor. A yield factor is a number that is used to determine a depth of damage of a breakout in a wellbore wall (e.g., borehole enlargement initiated by shear failure of the rock due to excessive compressive stresses).

In one or more embodiments, a depth of damage engine (114) is configured to calculate, using the yield factor, the depth of damage (e.g. depth of damage (140)) of the breakout in the wellbore wall, and divide the depth of damage (140) by a radius of the wellbore to calculate a depth of damage ratio. The traditional wellbore stability approach is more conservative and does not consider the post failure behavior (i.e., the material is kept in the elastic range and in gauge). The critical depth of damage is a depth (140) at which damage to the rock of a wellbore wall becomes a problem for the integrity of the wellbore. The depth of damage (140) equals a maximum depth into the wellbore wall at which the yield factor is greater than 1. In other words, the depth of damage (140) is a length radiating outward from the wellbore into the wellbore wall, and perpendicular to the wellbore wall, at a particular depth in the wellbore. A depth of damage ratio may be used to calculate a volume of unstable wellbore wall material, such as the aforementioned yielded rock.

In one or more embodiments, an unstable material engine (115) is configured to determine, using the depth of damage ratio, a volume of unstable wellbore wall material referred to as yielded rock. The term "yielded rock" may pertain to rock, fluids, gases, or any other material in the wellbore wall, and may be measured in cubic meters or another appropriate measurement. The unstable material engine (115) may receive the depth of damage ratio from the depth of damage engine (114). After determining the volume of unstable wellbore wall material, the unstable material engine (115) may process (i.e., modify, transform, format) the volume of unstable wellbore wall material, and then transmit the volume of unstable wellbore wall material to the mud weight engine (116) for further processing. In parallel, the unstable material engine (115) may pass control of the system (100) to any other engine. The unstable material engine (115) may receive the depth of damage ratio from other entities beyond the depth of damage engine (114), and may perform other functions beyond those disclosed.

In one or more embodiments, a mud weight engine (116) is configured to determine an initial mud weight and a minimum mud weight. The initial mud weight is the mud weight that exists at the point of interest in the wellbore wall at the time the measurement is taken. The minimum mud weight is the mud weight required to prevent a shear failure in the wellbore wall. After determining the initial mud weight and the minimum mud weight, the mud weight engine (116) may process (i.e., modify, transform, format) the initial mud weight and the minimum mud weight, and then transmit the initial mud weight and the minimum mud weight to the collapse gradient engine (117) for further processing. In parallel, the mud weight engine (116) may pass control of the system (100) to any other engine. The mud weight engine (116) may perform other functions beyond those disclosed.

In one or more embodiments, a collapse gradient engine (117) is configured to determine a collapse gradient considering different depths of damage. A collapse gradient may indicate the following states of a wellbore wall: zero degradation (i.e., a perfect hole, no failure), low risk degradation—a stable hole but with some manageable failure, medium/high risk degradation—significant breakout/failure, or failure expected (i.e., failure by design). In one or more embodiments, the extent of the wellbore wall collapse is represented by the depth of damage and the collapse gradient corresponds to a drilling fluid pressure limit that maintains the depth of damage at a target level. For example, the target level of the depth of damage may correspond to a state of the wellbore wall described above.

In one or more embodiments, a shear failure engine (118) is configured to determine a shear failure. A shear failure is a failure of a material due to a shear stress, specifically the component of stress coplanar with the material's cross section. Shear stress arises from the force vector component parallel to the cross section. After determining the shear failure, the shear failure engine (118) may process (i.e., modify, transform, format) the shear failure, and then transmit the shear failure to the actual depth of damage engine (119) for further processing. In parallel, the shear failure engine (118) may pass control of the system (100) to any other engine. The shear failure engine (118) may perform other functions beyond those disclosed.

In one or more embodiments, an actual depth of damage engine (119) is configured to calculate, using the minimum mud weight and the collapse gradient, an actual depth of damage experienced during drilling as a function of depth. The actual depth of damage experienced during drilling is a measurement of how much of a wellbore wall may have been compromised at different depths in a wellbore. This function may be based, in part, on the drilling reports (101) including the mud weight (102) and the wellbore radius (103), the stress model (104), the failure criterion (105), and the image logs (106). The actual depth of damage engine (119) may perform other functions beyond those disclosed.

In one or more embodiments, a drilling problem engine (120) is configured to identify, using the actual depth of damage, a drilling problem resulting in a non-productive drilling period. A drilling problem may be any issue that results in a drilling period operating at less than 100% efficiency. Examples of drilling problems may include a caliper increase, a breakout indicated in an image log, and an undesirable radial change in sonic velocity. The drilling problem engine (120) may perform other functions beyond those disclosed.

In one or more embodiments, a limit of failure engine (121) is configured to determine, based on the drilling problem, the limit of failure. As noted above, the limit of failure is an upper limit to the amount of damage identified before wellbore instability presents a problem to the drilling process. In one or more embodiments, the amount of damage is represented by the depth of damage and/or the depth of damage ratio. In this context, the limit of failure may be referred to as the limit of the depth of damage and/or the limit of the depth of damage ratio. The limit of failure may be, for example, the limit of failure (141). The limit of failure engine (121) may receive the drilling problem from the drilling problem engine (120). After determining the limit of failure, the limit of failure engine (121) may process (i.e., modify, transform, format) the limit of failure, and then transmit the limit of failure to the drilling parameters engine (122) for further processing. In parallel, the limit of failure engine (121) may pass control of the system (100) to any other engine. The limit of failure engine (121) may receive the drilling problem from other entities beyond the drilling problem engine (120), and may perform other functions beyond those disclosed.

In one or more embodiments, a drilling parameters engine (122) is configured to determine, using the limit of failure, drilling parameters, and modify, using the drilling parameters, a drilling plan to avoid a breakout in the wellbore wall relating to the limit of failure. Drilling parameter may include any functional changes to a drilling plan (including changed to the use of the wireline (107)) that affect how the drilling process is performed. The drilling parameters may be, for instance, the drilling parameters (142). The drilling parameters engine (122) may receive the limit of failure from the limit of failure engine (121). After determining the drilling parameters, the drilling parameters engine (122) may process (i.e., modify, transform, format) the drilling parameters, and then transmit the drilling parameters to the optimum depth of damage engine (123) for further processing. In parallel, the drilling parameters engine (122) may pass control of the system (100) to any other engine. The drilling parameters engine (122) may receive the limit of failure from other entities beyond the limit of failure engine (121), and may perform other functions beyond those disclosed.

In one or more embodiments, an optimum depth of damage engine (123) is configured to determine an optimum depth of damage for the wellbore, and calculate a mud window based on the optimum depth of damage. The optimum depth of damage is a value for the depth of damage that allows drilling to proceed at peak efficiency with a minimal risk of a wellbore breakout. The mud window is the range of safe mud weights in the wellbore occurring during the drilling process. The optimum depth of damage engine (123) may perform other functions beyond those disclosed.

In one or more embodiments, the server B (126) is configured to host a data repository (127). The data repository (127) may contain data associated with the depth of damage application (111). The data repository (127) may be a relational database that stores data entries associated with the depth of damage application (111). The data repository (127) may also be a spreadsheet containing data cells associated with the depth of damage application (111). In one or more embodiments, the data repository (127) may be implemented with many technologies. The data repository (127) may receive data from various sources, including the depth of damage application (111), and any of the engines of the depth of damage application (111), over a network B (125). After receiving data from the depth of damage application (111), the data repository (127) may process (i.e., modify, transform, format) the data, and then store the data. The data may include a depth of damage (128), a collapse gradient (129), an actual depth of damage (130), a drilling problem (131), a limit of failure (132), drilling parameters (133), a mud weight (134), and a stress model (135). The data repository (127) may receive and store data from other entities beyond the depth of damage application (111), and may perform other functions beyond those disclosed. Further, the server B (126), and the data stored on this server may be owned and/or operated by a service provider (e.g. the owner, developer, and/or manager of the depth of damage application (111)).

FIG. 2 shows an example well log in accordance with one or more embodiments. The example shown in FIG. 2 may be used, for example, with the system (100), to determine a limit of failure in a wellbore wall. The elements shown in FIG. 2 may differ among embodiments, and one or more of the elements may be optional.

In FIG. 2, a well log (200) identifies various characteristics of a wellbore. In other words, the well log (200) is a detailed record of the geologic formations in a wellbore. The well log (200) may be based on visual inspection of samples brought to the surface (e.g., cutings) and/or on physical measurements made by instruments lowered into the wellbore (e.g., geophysical logs). Typically, the logging procedure includes lowering a logging tool on the end of a wireline, or logging while drilling into the wellbore to measure rock and fluid properties of the formation. An interpretation of these measurements is then made to locate and quantify potential reservoir zones (e.g., depth zones traversed by a vertical well) containing hydrocarbons. The well log (200) may measure the electrical, acoustic, radioactive, electromagnetic, nuclear magnetic resonance, and other properties of the rocks and their contained fluids in the wellbore walls. Specifically, the well log (200) may also be used to determine depths of damage as a function of axial distance (e.g., depth in a vertical well) in the wellbore. For example, depth of damage (202), depth of damage (204), and depth of damage (206) may all be calculated using the well log (200). Each of these depths of damage may be calculated at different depths in the vertical wellbore. For instance, depth of damage (202) may be located at a depth of 7975 feet down the wellbore, depth of damage (204) may be located at a depth of 8075 feet down the wellbore, and depth of damage (206) may be located at a depth of 8110 feet down the wellbore. The areas surrounding the wellbore within the depth of damage (202), depth of damage (204), and depth of damage (206) may include rock, fluid, hydrocarbons, and other elements typically found in a wellbore wall. The well log (200) may indicate the spatial coordinates of these elements and measurements of the depths of damage within the walls of the wellbore. There may be various other data that may be included in the well log (200).

Figure 3:
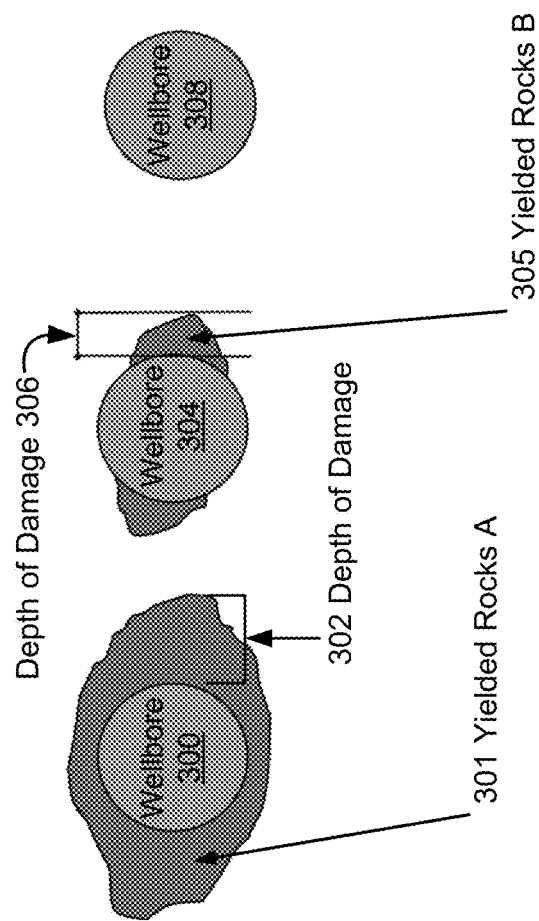
FIG. 3 shows an example wellbore of determining a limit of failure in a wellbore wall in accordance with one or more embodiments.

FIG. 3 shows an example wellbore in accordance with one or more embodiments. The example shown in FIG. 3 may be used, for example, with the system (100), to determine a limit of failure in a wellbore wall. The elements shown in FIG. 3 may differ among embodiments, and one or more of the elements may be optional.

In FIG. 3, various wellbores and different types of depths of damage are shown. In one or more embodiments, the wellbore (300), wellbore (304), and wellbore (308) depict cross-sectional views at various depths along a trajectory of the vertical borehole (313) shown in FIG. 1.1 above. For example, the depth of damage (302) may represent an area of damaged material (i.e., yielded rocks A (301)) surrounding the wellbore (300) in a substantially elliptical formation around the wellbore (300). The measure of the depth of damage (302) may be the length of the damaged material from the wall of the wellbore (300) to the end of the damaged region, at any point around the circumference of the damaged area.

In another example, the depth of damage (306) may represent an area of damaged material (i.e., yielded rocks B (305)) extending from the wellbore (304) in a formation along an axis of the wellbore (304) on either side of the wellbore (304). The measure of the depth of damage (306) may be the length of the damaged material from the wall of the wellbore (304) to the end of the damaged region along the axis (e.g., the greatest length of damaged material). Additionally, other axes of the wellbore (304) may be used to compute the depth of damage (306). Wellbore (308) displays walls with no damaged material; therefore no depth of damage may be calculated. There may be various other geometries of damaged material occurring in the walls of a wellbore that may be used to calculate depths of damage.

Even though wellbore degradation may be observed in a borehole image and caliper logs, damage in the wellbore wall may go undetected during the drilling process if the damaged material (e.g., yielded rocks) remains in place. Many factors of drilling practice affect when excess cavings at borehole wall surface are noticed. The drilling practice factors may include drilling fluid (e.g., mud) properties, drilling rates, hole-cleaning procedures etc. Generally, there is an upper limit to the amount of damage occurred during drilling before wellbore instability becomes a drilling problem. While higher drilling fluid density (e.g., higher mud weight) ensures a better in-gauge hole with minimum or no caliper enlargement, it is not always desirable to design the drilling plan for the best in-gauge hole, such as the wellbore (308) described above. For example, higher mud weight increases cost and reduces rate of penetration (ROP). In one or more embodiments, the drilling plan may specify to drill with a lower mud weight provided that cavings can be managed by appropriate drilling practices to control wellbore instability. For example, the target level of depth of damage may be between 10% and 20% of the wellbore radius or between 5% and 30% of the wellbore radius, such as the wellbore (304) described above.

Embodiments disclosed herein provide a method to identify a limit of damage that can be managed with appropriate drilling practices determined by a geomechanics engineer. To quantify this limit, caliper logs and drilling events of drilled wells are compared to corresponding depth of damage computation. Analysis of the comparison results includes an evaluation of the historical amount of damage that caused non-productive time periods when these wells were drilled. This evaluation is then used as a design criterion for the lower limit of the drilling fluid density (e.g., mud weight).

Figure 4:
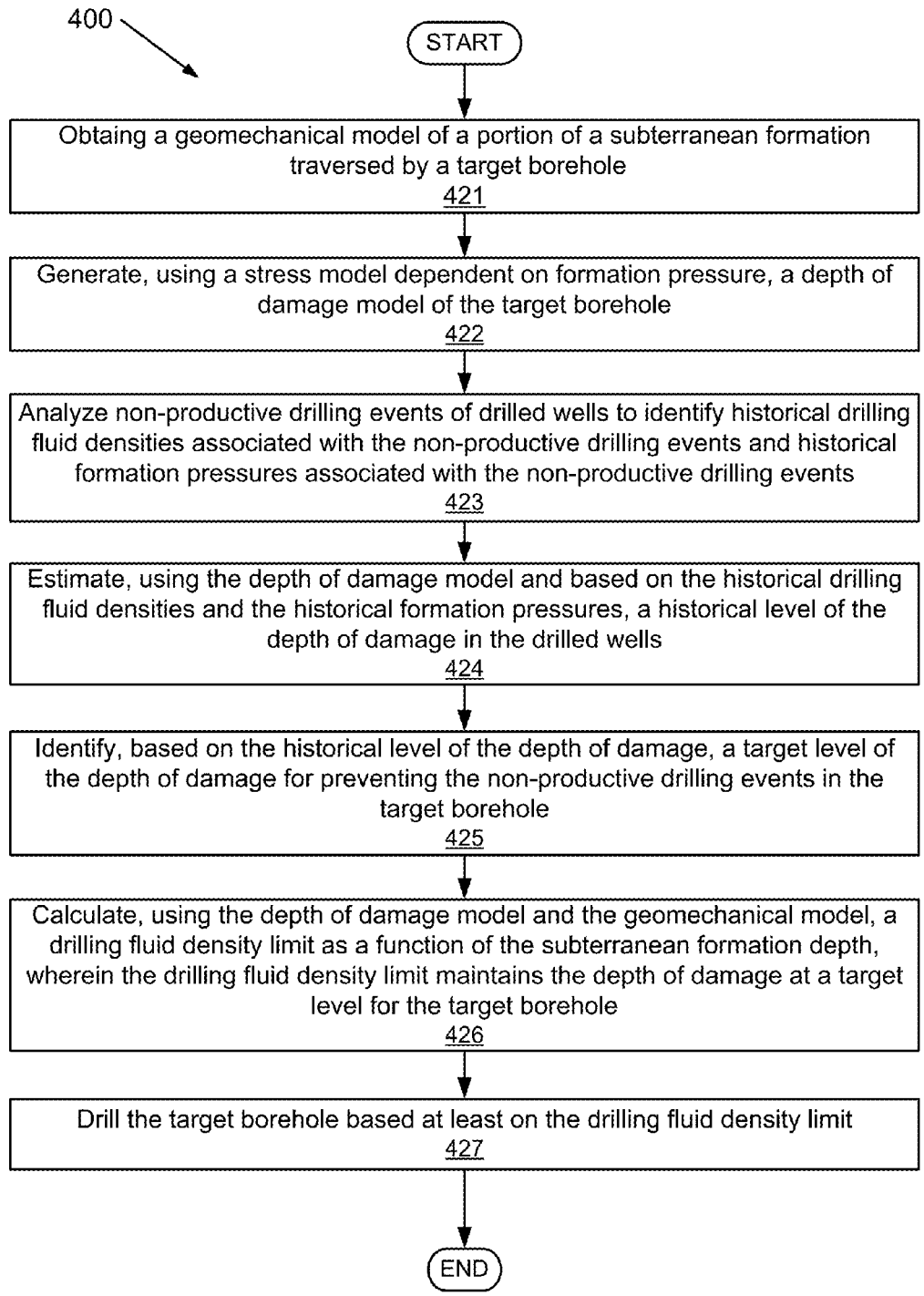
FIG. 4 shows a flowchart of determining a limit of failure in a wellbore wall in accordance with one or more embodiments.

FIG. 4 shows a flowchart (400) in accordance with one or more embodiments. The flowchart (400) may be used, for example, with the system (100), to determine a limit of failure. Specifically, the process of the flowchart (400) is used to calculate a limit of drilling fluid density for maintaining a manageable amount of damage in a wellbore wall during drilling. The sequence of the flowchart (400) shown in FIG. 4 may differ among embodiments, and one or more of the elements may be performed in parallel and/or may be optional. Accordingly, the scope should not be considered limited to the specific arrangement of elements shown in FIG. 4.

In one or more embodiments, Elements 421 and 422 in the flowchart (400) generate a depth of damage model, Elements 423 through 425 determine a target level of depth of damage using the depth of damage model based on historical drilling events of drilled wells, Elements 426 and 427 are then used to develop a wellbore stability (WBS) model and drill the target well based on the WBS model. In particular, a drilling plan is generated based on the WBS model to minimize mechanical wellbore instability during drilling.

Initially in Element 421, a geomechanical model of a portion of the subterranean formation traversed by the target borehole is obtained. Generally, the geomechanical model describes stress profiles and rock mechanical properties at various locations in the subterranean formation. For example, the stress profile may include formation stress information (e.g., formation pressure) along the trajectories of drilled wells and the target well.

In Element 422, a depth of damage model of the target borehole is generated that describes amount of damage surrounding a wellbore as a function of internal pressure exerted onto the wellbore wall by the drilling fluid (i.e., drilling fluid pressure). In one or more embodiments, the depth of damage model is generated using a stress model that is dependent on the formation pressure and the drilling fluid pressure. The amount of damage, or the volume of yielded rock is related to partial support of the wellbore wall by the drilling fluid pressure against the near-field stresses surrounding the wellbore. In one or more embodiments, the depth of damage model is used to estimate a lower limit for the drilling fluid pressure that can be managed with good drilling practices without excessive nonproductive time. For example, the depth of damage model may be generated by: 1) transformation of far-field earth stresses into near-field stresses surrounding the wellbore; and 2) compare the near-field stresses surrounding the wellbore to a rock failure criterion. Accordingly, the depth of damage model may then be used to 3) calculate drilling fluid pressure limit that will keep these near-field stresses in a range to prevent excessive shear failure; 4) calculate the drilling fluid pressure limit for different depths of investigation, and 5) identify regions of potential instability surrounding the wellbore.

In one or more embodiments, the stress model includes Eq. (1) through Eq. (3) below. In this stress model, the far-field earth stresses are represented by setting in these equations the condition of r=infinity, or being substantially greater than R. In one or more embodiments, the near-field wellbore stresses are represented by setting in these equations the condition of r/R being a number ranging from 1 to 5.

The stress distribution around a circular hole in an infinite plate in one-dimensional is shown in Eq. (1) that assume plane strain condition normal to the borehole axis. Specifically, Eq. (1) expresses the stresses in terms of cylindrical polar coordinates r, $\theta$ and z, where r represents the distance from the borehole axis, $\theta$ is the azimuth angle relative to the x-axis, and z is the position along the borehole axis. In addition, R is the wellbore radius, $P_w$ is the drilling fluid pressure exerted onto the wellbore wall, $\tau$ and $\sigma$ with various subscripts are components of the shear and normal stresses.

$$\sigma_r = \frac{(\sigma_x + \sigma_y)}{2}\left(1 - \frac{R^2}{r^2}\right) + \frac{(\sigma_x - \sigma_y)}{2}\left(1 - \frac{4R^2}{r^2} + \frac{3R^4}{r^4}\right)\cos 2\theta +$$
$$\tau_{xy}\left(1 - \frac{4R^2}{r^2} + \frac{3R^4}{r^4}\right)\sin 2\theta + p_w \frac{R^2}{r^2}$$
$$\sigma_\theta = \frac{(\sigma_x + \sigma_y)}{2}\left(1 + \frac{R^2}{r^2}\right) - \frac{(\sigma_x - \sigma_y)}{2}\left(1 + \frac{3R^4}{r^4}\right)\cos 2\theta -$$
$$\tau_{xy}\left(1 + \frac{3R^4}{r^4}\right)\sin 2\theta - p_w \frac{R^2}{r^2}$$
$$\sigma_z = \sigma_z^0 - \nu\left(2(\sigma_x - \sigma_y)\frac{R^2}{r^2}\cos 2\theta + 4\tau_{xy}\frac{R^2}{r^2}\sin 2\theta\right)$$
$$\tau_{r\theta} = \frac{(\sigma_x - \sigma_y)}{2}\left(1 + \frac{2R^2}{r^2} - \frac{3R^4}{r^4}\right)\sin 2\theta$$
Eq. (1)

The elastic solution for the anti-plane shear problem can be written as in Eq. 2 below.

$$\sigma_{rz} = (\tau_{xz}\cos\theta + \tau_{yz}\sin\theta)\left(1 - \frac{R^2}{r^2}\right)$$
$$\sigma_{\theta z} = (-\tau_{xz}\sin\theta + \tau_{yz}\cos\theta)\left(1 + \frac{R^2}{r^2}\right)$$
Eq. (2)

The solution of an inclined borehole is obtained by superposition of Eq. (1) and Eq. (2).

The stresses at the wellbore wall, where r=R, are simplified to:

$\sigma_r = P_w$ $\sigma_\theta = \sigma_x + \sigma_y - 2(\sigma_x - \sigma_y)\cos 2\theta - p_w$ $\sigma_z = \sigma_z^0 - 2\nu[(\sigma_x - \sigma_y)\cos 2\theta + 2\tau_{xy}\sin 2\theta]$ $\tau_{\theta z} = 2(-\tau_{xz}\sin\theta + \tau_{yz}\cos\theta)$ $\tau_{r\theta} = \tau_{rz} = 0$   Eq. (3)

Eq. (1) through Eq. (3) is based on linear-elasticity and the corresponding stress model is an elastic stress model. In other embodiments, stress equations describing thermo-poroelasticity or other non-linear rock behavior under stress are used to specify a poroelastic stress model or other non-linear stress model. In one or more embodiments, the depth of damage model may be generated using the elastic stress model, the poroelastic stress model, or other non-linear stress model.

Under excessive stresses, rock deforms permanently and possibly also falls apart, which is referred to as rock failure. Rock failure is the origin of severe problems such as borehole instability and solids production. Various failure criteria have been used by those skilled in the art to define conditions when a rock is likely to fail. These failure criteria include Mohr-Coulomb failure criterion, Mogi-Coulomb failure criterion, Drucker-Prager failure criterion, Modified-Lade failure criterion, etc.

In one or more embodiments, shear failure occurs to form yielded rock surrounding the wellbore if the stresses determined based on Eq. (1) and Eq. (2) above falls outside of a failure envelop defined by a selected failure criterion, such as one of the failure criteria noted above. For example, the Coulomb failure criterion defines the failure envelop for initially intact rocks by Eq. (4) below.

$\tau = S_0 + \mu\sigma_n$   Eq. (4)

where $\tau$ and $\sigma_n$ are shear and normal stress, $S_0$ is cohesion, and $\mu$ is coefficient of internal friction. In one or more embodiments, the stresses determined based on Eq. (1) and Eq. (2) above are compared to the failure envelop define by Eq. (4) to determined if shear failure occurs resulting in yielded rock at any particular position surrounding the wellbore. Other failure criterion may be based on other type of rock failure and described in different equations.

During drilling, the drilling fluid pressure is dependent on the vertical depth in the borehole and the drilling fluid density. Based on a given drilling fluid density using the stress model described by Eq. (1) through Eq. (3), the boundary of yielded rocks at a given vertical depth in the wellbore is estimated based on the failure criterion. Specifically, the yielded rock boundary is estimated as the radial distance r where the failure criterion indicates a failure (e.g., shear failure) occurrence. Accordingly, the depth of damage is estimated as the difference between this radial distance r and the wellbore radius R. Due to the dependence of drilling fluid pressure on the vertical depth, the depth of damage model estimates the depth of damage as a function of formation pressure, drilling fluid density, in situ stresses, rock mechanical properties, and vertical depth in the wellbore.

In Element 423, non-productive drilling events of drilled wells are analyzed. The non-productive drilling events include, but not limited to highly overgauged hole sections, tight hole, cavings, packoff, mud losses, influx, other indication of caliper increase such as a breakout, that are identified from caliper log or other image logs; and radial change in sonic velocity. Each non-productive drilling event may indicate a level and type of drilling problem, such as kick, washout, breakout, knockout, echelon, etc. known to those skilled in the art. Depending on the context, these non-productive drilling events of previously drilled wells may be referred to as historical non-productive drilling events. In one or more embodiments, these non-productive drilling events of drilled wells in a region with similar geomechanical characteristics as the location of the planned target well are analyzed. For example, the drilled wells may be in the vicinity of the target well. In particular, the same geomechanical model is applicable to both the drilled wells and the target well such that analysis results of the drilled wells can be applied to develop the drilling plan for the target well.

In one or more embodiments, the analysis of the non-productive drilling events identifies the drilling fluid densities used for these drilled wells and the formation pressures logged during drilling. These drilling fluid densities and the formation pressures are referred to as historical drilling fluid densities and historical formation pressures. The historical drilling fluid densities and formation pressures are associated with wellbore depths where the drilling events were logged. In one or more embodiments, these non-productive drilling events are manually analyzed by a geomechanics engineer. In one or more embodiments, these non-productive drilling events are automatically analyzed using a computer algorithm. In one or more embodiments, these non-productive drilling events are analyzed by a geomechanics engineer with the help of a computer algorithm in a semi-automatic process.

In Element 424, using the depth of damage model and based on the historical drilling fluid densities and the historical formation pressures, historical levels of the depth of damage in the drilled wells are estimated. In one or more embodiments, for each historical non-productive drilling event analyzed, the corresponding historical fluid density and formation pressure, and the associated wellbore depth are used as inputs to the depth of damage model to estimate the amount of damage occurred when the particular historical non-productive drilling event happened. This estimated amount of damage is referred to as a historical depth of damage for the particular historical non-productive drilling event. In one or more embodiments, sufficient number of historical non-productive drilling events are collected and analyzed such that a distribution of historical depths of damage is statistically meaningful. For example, different depths of damage (0%, 5%, 10%, 20%, 30%, etc.) are observed in the distribution to correlate the historical depths of damage to various levels and/or types of drilling problems indicated in the historical non-productive drilling events. Accordingly, the amount of damage that became problematic for a particular type of drilling problems observed in the historical non-productive drilling events can be determined.

In Element 425, based on the distribution of historical depths of damage, a target level of the depth of damage is identified for preventing the historical non-productive drilling events to re-occur in the target borehole to an unmanageable extent. For example, the target level of the depth of damage may be identified based on a manageable level of drilling problems considering an achievable drilling practice for the target borehole. In particular, the achievable drilling practice includes drilling fluid density variation, equipment and scheduling of borehole monitoring, target ROP, etc. In one or more embodiments, the target level of the depth of damage is identified as the amount of damage corresponding to a transition from breakout drilling condition to washout drilling condition. In such embodiments, drilling in the breakout condition is considered as manageable based on the achievable drilling practice while drilling in any washout condition is to be avoided. For example, in some geographical region, the transition from breakout drilling condition to washout drilling condition may occur at 20% depth of damage. In another example for a different geographical region, the transition from breakout drilling condition to washout drilling condition may occur at 10% depth of damage.

In Element 426, using the depth of damage model and the geomechanical model, a drilling fluid density limit is calculated with the requirement to maintain the depth of damage at the target level identified in Element 425. As noted above, the depth of damage model estimates the depth of damage as a function of formation pressure, drilling fluid density, and vertical depth in the wellbore. In one or more embodiments, for each vertical depth in the planned trajectory of the target borehole, the formation pressure is obtained from the geomechanical model. With the given depth of damage at the target level, the formation pressure looked up from the geomechanical model, and the vertical depth, the corresponding drilling fluid density can be derived from the depth of damage model. This derived drilling fluid density is referred to as the drilling fluid density limit and is a function of the subterranean formation depth. Specifically, using drilling fluid with a lower density than this drilling fluid density limit is expected to induce a larger depth of damage than the target level, and vice versa.

In one or more embodiments, the target level of depth of damage for setting the drilling fluid density limit corresponds to the transition between breakout drilling condition and washout drilling condition. In such embodiments, the drilling fluid density limit corresponds to the onset of washout in the borehole. In one or more embodiments, the drilling fluid density limit may also be set to correspond to onset of breakout, kick/influx, or other fracturing events such as initiation, reopening, etc. of a fracture. For example, 0% depth of damage may correspond to the transition from the elastic range to shear breakout. In another example, tensile failure occurs if the stress-state exceeds the tensile strength of the rock. Whenever hoop or radial stress becomes tensile the rock is prone to fail in tension creating fracture. Many unscheduled rig events are due to loss of circulation caused by tensile failure. The maximum drilling fluid density limit before tensile fracture initiation is referred to as breakdown gradient.

In one or more embodiments, the functional relationship between one or more drilling fluid density limits and the subterranean formation depth is included in a wellbore stability (WBS) model. In Element 427, the target borehole is drilled based at least on the drilling fluid density limit identified by the WBS model. An example of the WBS model is shown in FIGS. 5.1 and 5.2 that can be used to develop the drilling plan for the target borehole.

As shown in FIG. 5.1, track A (501) shows example mechanical stratigraphy of a target region where the target borehole is planned. Specifically, sand intervals extend from vertical depth 2600 m to 2750 m and from 2790 m to 2820 m. In addition, sand intervals extend from 2750 m to 2790 m and from 2820 m going deeper. Track B (502) shows example stress profiles and rock mechanical properties of the geomechanical model applicable to the target region. Specifically, unconfined compressive strength (UCS), friction angle (FANG1), static Poisson's ratio (Pr_sta1), and Young's modulus (YME) represent rock mechanical properties, respectively. Track C (503) shows the WBS model identifying various drilling fluid density limits. In particular, the horizontal axis starts at 0 at the left end of the scale to end at 1.8 g/cm$^3$ at the right end of the scale. An expanded form of track C (503) is shown in FIG. 5.2 for clarity. Track D (504) shows a modeled borehole image showing the wellbore stability events predicted by the WBS model based on a drilling fluid density profile (525). Specifically, the drilling fluid density profile (515) is set at a constant drilling fluid density throughout the vertical depth zone above 2800 m and is changed to a lower drilling fluid density from 2800 m going deeper into the formation. In the modeled borehole image, the wellbore stability events are presented along the horizontal axis spanning from 0 to 360 degree in azimuth direction reflecting the azimuth dependency of formation pressure.

In the example shown in FIGS. 5.1 and 5.2, the WBS model is generated based on drilled wells in the same target region where the target borehole is planned. In other words, these drilled wells are also statistically represented by the mechanical stratigraphy and geomechanical model shown in track A (501) and track B (502), respectively. Track E (505) shows actual caliper log and bit size of a drilled well for comparing to the predicted wellbore stability events in the modeled borehole image of track D (504).

As shown in the track C (503), shaded areas represent the drilling fluid density windows to drill the well. Each drilling fluid density window is bounded by a lower limit and a higher limit. In particular, shaded area (511) represents drilling fluid density above 0 but lower than the pore pressure and corresponds to kick risk, the shaded area (512) represents the washout zone (e.g., depth of damage >20% with expected volume of cavings) with drilling fluid density higher than the pore pressure but lower than a washout zone limit, the shaded area (513) represents the breakout zone (e.g., depth of damage <20% with small amount or no cavings) with drilling fluid density higher than the washout zone limit but lower than a breakout zone limit, and the shaded area (514) represents the stable zone (i.e., in gauge borehole is maintained) with drilling fluid density higher than the breakout zone limit but lower than a stable zone limit. There are two additional shaded areas that correspond to the fracture zone where an induced fracture is created and the losses zone where natural or induced fractures are reopened.

Further as shown in track C (503), the drilling fluid density profile (515) lies primarily within the shaded area (513), or the breakout zone where the wellbore fails in shear and produces breakouts. The wellbore stability events predicted by the WBS model in track D (504) are in good agreement with the caliper log and bit size shown in track E (505). In particular, the drilling fluid density profile (515) intersects the washout zone limit (i.e., the boundary between the shaded areas (512) and (513)) in the section around 2640 m and the section from 2720 m to 2750 m. This indicates that the shale interval (<2750 m) was drilled with approximately 20% depth of damage for these sections. As shown in the modeled borehole image of track D (504), no major drilling event is predicted for this shale interval indicating 20% of depth of damage as possible limit before drilling becomes problematic.

Track E (505) also shows that the sand interval (2750-2790 m) is more stable and remains near in-gauge as predicted by WBS model, again in agreement with caliper logs of track E (505). However, the WBS model predicts a reduction of the fracture gradient and minimum horizontal stress around 2760 m based on the drilling fluid density profile (515) intersecting the fracture zone and the losses zone. This would indicate a risk of losses if an excessive drilling fluid density is used, and is consistent with the predicted drilling events shown in track D (504) as well as the crossing between caliper and bit size shown in track E (505).

From 2800 m and deeper, the drilling profile (515) changes to a lower drilling fluid density lying within the shaded area (512) where more than 20% depth of damage occurred. As a result, excessive caliper and cavings can be seen in track D (504) and track E (505) causing non-productive time during drilling. Accordingly, the WBS model suggests this lower drilling fluid density should be avoided for future wells.

In summary, once the geomechanical model is calibrated, the historical drilling events analyzed and the drilling fluid density limits identified, the WBS model for a planned target well is developed to forecast wellbore stability during drilling. In the example shown in FIGS. 5.1 and 5.2, drilling fluid density between 1.10 and 1.15 $g/cm^3$ is suggested based on the WBS model. This drilling fluid density is sufficient to keep the stability conditions in the unstable shale, while keeping under control the risk of losses into the fractured sands. Traditional wellbore stability prediction methodology would suggest a higher drilling fluid density (e.g., 1.5 $g/cm^3$) to perform the drilling in the shaded area (514). With this higher drilling fluid density, losses will occur in the sand section below 3300 m.

Figure 6:
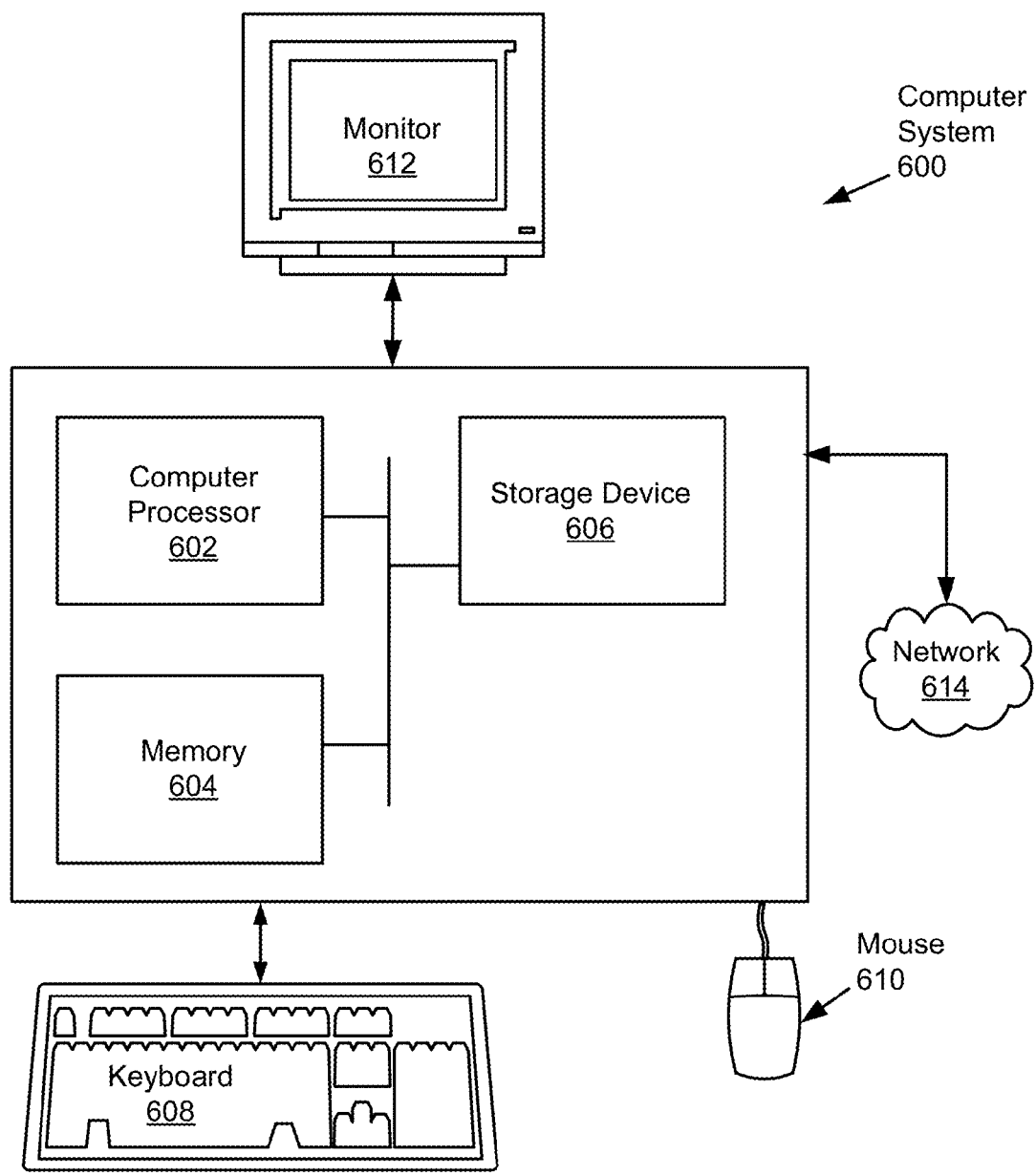
FIG. 6 shows a computer system in accordance with one or more embodiments.

Embodiments may be implemented on virtually any type of computer regardless of the platform being used. For example, as shown in FIG. 6, a computer system (600) includes one or more computer processor(s) (602), an associated memory (604) (e.g. random access memory (RAM), cache memory, flash memory, etc.), a storage device (606) (e.g. a hard disk, an optical drive such as a compact disk drive or digital video disk (DVD) drive, a flash memory stick, etc.), and numerous other elements and functionalities typical of today's computers (not shown). In one or more embodiments, the computer processor (602) is hardware. For example, the processor may be an integrated circuit. The computer system (600) may also include input means, such as a keyboard (608), a mouse (610), or a microphone (not shown). Further, the computer system (600) may include output means, such as a monitor (612) (e.g., a liquid crystal display (LCD), a plasma display, or cathode ray tube (CRT) monitor). The computer system (600) may be connected to a network (614) (e.g. a local area network (LAN), a wide area network (WAN) such as the Internet, or any other type of network) via a network interface connection (not shown). In one or more embodiments, many different types of computer systems exist, and the aforementioned input and output means may take other forms. Generally speaking, the computer system (600) includes at least the minimal processing, input, and/or output means to practice embodiments.

Further, in one or more embodiments, one or more elements of the aforementioned computer system (600) may be located at a remote location and connected to the other elements over a network. Further, embodiments may be implemented on a distributed system having a plurality of nodes, where each portion (e.g., stress model engine, yield factor engine, depth of damage engine, unstable material engine, mud weight engine, collapse gradient engine, shear failure engine, actual depth of damage engine, drilling problem engine, limit of failure engine, drilling parameters engine, optimum depth of damage engine) may be located on a different node within the distributed system. In one embodiment, the node corresponds to a computer system. Additionally, the node may correspond to a processor with associated physical memory. The node may also correspond to a processor or micro-core of a processor with shared memory and/or resources. Further, software instructions in the form of computer readable program code to perform embodiments may be stored, temporarily or permanently, on a non-transitory computer readable storage medium, such as a compact disc (CD), a diskette, a tape, memory, or any other computer readable storage device.

While the invention has been described with respect to a limited number of embodiments, those skilled in the art, having benefit of this disclosure, will appreciate that other embodiments can be devised which do not depart from the scope as disclosed herein. Accordingly, the scope should not be limited by this description.

What is claimed is:

1. A method to determine a drilling fluid density limit for maintaining a target amount of rock failure in a drilling operation, comprising:
   obtaining a geomechanical model of a portion of a subterranean formation traversed by a target borehole, wherein the geomechanical model comprises a formation pressure dependent on subterranean formation depth;
   generating, by a computer processor using a stress model dependent on the formation pressure, a depth of damage model of the target borehole based at least in part on a yield factor, wherein the depth of damage model describes a relationship between a drilling fluid pressure and a depth of damage resulting from the drilling fluid pressure, and the yield factor is representative of a ratio between applied stress and resistant stress,
      wherein the depth of damage represents a radial distance across a modeled amount of yielded rock surrounding the target borehole, and
      wherein the modeled amount of the yielded rock is calculated using the stress model according to a pre-determined failure criterion, the pre-determined criterion including the yield factor; and
   calculating, by the computer processor using the depth of damage model and the geomechanical model, the drilling fluid density limit as a function of the subterranean formation depth,
      wherein the drilling fluid density limit maintains the depth of damage at a target level for the target borehole, and
      wherein the drilling fluid density limit corresponds to a depth gradient of the drilling fluid pressure,
   wherein the target borehole is drilled based at least on the drilling fluid density limit.

2. The method of claim 1, further comprising:
   determining, based on the drilling fluid density target, a mud weight for drilling the target borehole,
   wherein the drilling fluid pressure in the target borehole is dependent on an integral sum of the mud weight in the target borehole.

3. The method of claim 1, wherein the target level of the depth of damage is within a range of 5 percent to 30 percent of a wellbore radius.

4. The method of claim 1, further comprising:
   identifying a plurality of drilled wells traversing the portion of the subterranean formation;
   analyzing non-productive drilling events of the plurality of drilled wells to identify historical drilling fluid densities associated with the non-productive drilling events and historical formation pressures associated with the non-productive drilling events;
   estimating, using the depth of damage model and based on the historical drilling fluid densities and the historical formation pressures, a historical level of the depth of damage corresponding to the non-productive drilling events; and
   identifying, based on the historical level of the depth of damage, the target level of the depth of damage for preventing the non-productive drilling events in the target borehole.

5. The method of claim 1, wherein the non-productive drilling events comprise at least one selected from a group consisting of a caliper increase, a breakout in an image log, and a radial change in a sonic velocity.

6. The method of claim 1, wherein the stress model is at least one selected from a group consisting of an elastic stress model, a poroelastic stress model, and a non-linear stress model.

7. The method of claim 1, wherein the failure criterion is at least one selected from a group consisting of a Mohr-Coulomb failure criterion, a Mogi-Coulomb failure criterion, and a Modified-Lade failure criterion.

8. A system for performing a drilling operation with a target amount of rock failure, comprising:
   a drilling system having a drill string for drilling a target borehole in the field, wherein the drill string is configured to provide a circulation path for drilling fluid in the target borehole during drilling; and
   a surface unit comprising:
      a computer processor;
      a depth of damage application executing on the computer processor and configured to:
         obtain a geomechanical model of a portion of the subterranean formation traversed by the target borehole, wherein the geomechanical model comprises a formation pressure dependent on subterranean formation depth;
         generate, using a stress model dependent on the formation pressure, a depth of damage model of the target borehole based at least in part on a yield factor,
            wherein the depth of damage model describes a relationship between a drilling fluid pressure and a depth of damage resulting from the drilling fluid pressure, and
            wherein the depth of damage represents a radial distance across a modeled amount of yielded rock surrounding the target borehole, and the yield factor is representative of a ratio between applied stress and resistant stress, wherein the modeled amount of the yielded rock is calculated using the stress model according to a pre-determined failure criterion, the pre-determined criterion including the yield factor; and
         calculate, using the depth of damage model and the geomechanical model, a target drilling fluid density as a function of the subterranean formation depth,
            wherein the target drilling fluid density maintains the depth of damage at a target level for the target borehole, and
            wherein the target drilling fluid density corresponds to a depth gradient of the drilling fluid pressure; and
      a repository for storing the geomechanical model, the depth of damage model, and the target drilling fluid density as the function of the subterranean formation depth,
   wherein the target borehole is drilled based at least on the target drilling fluid density.

9. The system of claim 8, wherein the depth of damage application is further configured to:
   determine, based on the drilling fluid density target, a mud weight for drilling the target borehole,
   wherein the drilling fluid pressure in the target borehole is dependent on an integral sum of the mud weight in the target borehole.

10. The system of claim 8, wherein the target level of the depth of damage is within a range of 5 percent to 30 percent of a wellbore radius.

11. The system of claim 8, wherein the depth of damage application is further configured to:
- identify a plurality of drilled wells traversing the portion of the subterranean formation;
- analyze non-productive drilling events of the plurality of drilled wells to identify historical drilling fluid densities associated with the non-productive drilling events and historical formation pressures associated with the non-productive drilling events;
- estimate, using the depth of damage model and based on the historical drilling fluid densities and the historical formation pressures, a historical level of the depth of damage corresponding to the non-productive drilling events; and
- identify, based on the historical level of the depth of damage, the target level of the depth of damage for preventing the non-productive drilling events in the target borehole.

12. The system of claim 8, wherein the non-productive drilling events comprise at least one selected from a group consisting of a caliper increase, a breakout in an image log, and a radial change in a sonic velocity.

13. The system of claim 8, wherein the stress model is at least one selected from a group consisting of an elastic stress model, a poroelastic stress model, and a non-linear stress model.

14. The system of claim 8, wherein the failure criterion is at least one selected from a group consisting of a Mohr-Coulomb failure criterion, a Mogi-Coulomb failure criterion, and a Modified-Lade failure criterion.

15. A non-transitory computer readable storage medium storing instructions for determining a drilling fluid density limit for maintaining a target amount of rock failure in a drilling operation, the instructions executable on a processor and comprising functionality for:
- obtaining a geomechanical model of a portion of a subterranean formation traversed by a target borehole, wherein the geomechanical model comprises a formation pressure dependent on subterranean formation depth;
- generating, using a stress model dependent on the formation pressure, a depth of damage model of the target borehole based at least in part on a yield factor, wherein the depth of damage model describes a relationship between a drilling fluid pressure and a depth of damage resulting from the drilling fluid pressure, wherein the depth of damage represents a radial distance across a modeled amount of yielded rock surrounding the target borehole, and the yield factor is representative of a ratio between applied stress and resistant stress, and wherein the modeled amount of the yielded rock is calculated using the stress model according to a pre-determined failure criterion, the pre-determined criterion including the yield factor; and
- calculating, using the depth of damage model and the geomechanical model, the drilling fluid density limit as a function of the subterranean formation depth, wherein the drilling fluid density limit maintains the depth of damage at a target level for the target borehole, and wherein the drilling fluid density limit corresponds to a depth gradient of the drilling fluid pressure, wherein the target borehole is drilled based at least on the drilling fluid density limit.

16. The non-transitory computer readable storage medium of claim 15, further comprising:
- determining, based on the drilling fluid density target, a mud weight for drilling the target borehole, wherein the drilling fluid pressure in the target borehole is dependent on an integral sum of the mud weight in the target borehole.

17. The non-transitory computer readable storage medium of claim 15, wherein the target level of the depth of damage is within a range of 5 percent to 30 percent of a wellbore radius.

18. The non-transitory computer readable storage medium of claim 15, further comprising:
- identifying a plurality of drilled wells traversing the portion of the subterranean formation;
- analyzing non-productive drilling events of the plurality of drilled wells to identify historical drilling fluid densities associated with the non-productive drilling events and historical formation pressures associated with the non-productive drilling events;
- estimating, using the depth of damage model and based on the historical drilling fluid densities and the historical formation pressures, a historical level of the depth of damage corresponding to the non-productive drilling events; and
- identifying, based on the historical level of the depth of damage, the target level of the depth of damage for preventing the non-productive drilling events in the target borehole.

19. The non-transitory computer readable storage medium of claim 15, wherein the nonproductive drilling events comprise at least one selected from a group consisting of a caliper increase, a breakout in an image log, and a radial change in a sonic velocity.

20. The non-transitory computer readable storage medium of claim 15,
- wherein the stress model is at least one selected from a group consisting of an elastic stress model, a poroelastic stress model, and a non-linear stress model, and
- wherein the failure criterion is at least one selected from a group consisting of a Mohr-Coulomb failure criterion, a Mogi-Coulomb failure criterion, and a Modified-Lade failure criterion.

21. The method of claim 1, wherein calculating the drilling fluid density limit includes calculating the drilling fluid density limit for a plurality of different depths.

* * * * *